United States Patent [19]
Akamatsu et al.

[11] Patent Number: 5,982,907
[45] Date of Patent: Nov. 9, 1999

[54] AUDIO SIGNAL WAVEFORM EMPHASIS PROCESSING DEVICE AND METHOD

[75] Inventors: Norio Akamatsu, Tokushima; Jun-ichi Kakumoto, 346 Nishiyama, Kamihachiman-cho, Tokushima-shi, Tokuhsima -ken, both of Japan

[73] Assignee: Jun-Ichi Kakumoto

[21] Appl. No.: 08/955,973

[22] Filed: Oct. 22, 1997

[30] Foreign Application Priority Data

Oct. 22, 1996 [JP] Japan ..................................... 8-279311

[51] Int. Cl.$^6$ ....................................................... H03G 5/00
[52] U.S. Cl. ............................. 381/98; 333/28 T; 381/102
[58] Field of Search ............................. 381/98, 101–103, 381/61; 333/28 T, 28 R

[56] References Cited

U.S. PATENT DOCUMENTS

| | | | |
|---|---|---|---|
| 4,176,329 | 11/1979 | Moskowitz | ............................... 381/101 |
| 4,482,866 | 11/1984 | Crooks . | |
| 4,638,258 | 1/1987 | Crooks . | |

FOREIGN PATENT DOCUMENTS

| | | |
|---|---|---|
| 5349953 | of 1976 | Japan . |
| 56-132804 | 3/1980 | Japan . |
| 59-161110 | 3/1983 | Japan . |
| 61-295710 | 6/1985 | Japan . |
| 63-276311 | 5/1987 | Japan . |
| 495371 | 5/1998 | Japan . |

OTHER PUBLICATIONS

PCT/JP97/03815 Search report.

*Primary Examiner*—Ping Lee
*Attorney, Agent, or Firm*—Diller, Ramik & Wight, PC

[57] ABSTRACT

An audio signal waveform emphasis processing device performs even-order integration on an input audio signal using one or a plurality of double integrators and even-order differentiation on the input audio signal using one or a plurality of double differentiators so as to obtain even-order integrated signal and even-order differentiated signal, and adds the even-order integrated signal and the even-order differentiated signal to the input audio signal in the same phase or reverse-phase with the input audio signal, whereby sound quality of audio signal in audio equipment is greatly improved by obtaining a desired frequency-gain characteristic without destroying the mutual phase relationship between, in particular, the middle frequency range vs. high frequency range and the middle frequency range vs. low frequency range frequency components close to the middle frequency range of an input audio signal.

10 Claims, 12 Drawing Sheets

AUDIO SIGNAL WAVEFORM EMPHASIS PROCESSING DEVICE AND METHOD

BACKGROUND OF THE INVENTION

1. Field of the Invention

The present invention relates to an audio signal waveform emphasis processing device and method wherein the sound quality of audio devices of various types is improved by emphasis processing of the audio signal waveform, and in particular relates to an audio signal waveform emphasis processing device and method wherein sound quality is enormously improved in the low frequency range and in the high frequency range close to the middle frequency range as a result of emphasizing the low frequency range and the high frequency rance without destroying the characteristics of the original audio signal waveform so as to realize that sound quality in the middle frequency range is not deteriorated by a great deal of emphasis in the low and high frequency ranges.

2. Description of the Related Art

Conventionally, techniques for improving the sound quality of audio signals output from audio devices have concentrated exclusively on the frequency-gain characteristic, and scarcely any have taken into consideration the frequency-phase characteristic of the audio signal. This is because the phase characteristic of an audio signal has not been considered to be an important element in human auditory perception.

In regard to evaluation on the sound quality of audio devices, so long as basic performance such as frequency-gain characteristic, waveform distortion, and S/N ratio of the audio signal satisfied certain standards, practically no further evaluations have been conducted. Instead, evaluations depending on the subjective perceptions of individuals have been often relied on.

For this reason, conventionally, improvements in the sound quality of audio devices have been only made in terms of improvements in the frequency-gain characteristic of the amplifiers and filters, and scarcely any improvements in sound quality have been made taking into consideration the frequency-phase characteristic.

Thus, with such conventional techniques, if improvement in the frequency-gain characteristic of the amplifiers and filters constituting the audio device was sought, there was a concomitant change in the frequency-phase characteristic, giving rise to the problem that a high level of benefit in terms of improved sound quality satisfying the users has not been obtained in particular in the high frequency range and low frequency range close to the middle frequency range .

SUMMARY OF THE INVENTION

Accordingly, an object of the present invention is to provide an audio signal waveform emphasis processing device and method whereby a high level of sound quality improvement is made possible by enabling the desired frequency-gain characteristic to be obtained without destroying the phase relationship of the frequency components constituting the audio signal, in particular the phase relationship between the frequency components of the middle and low-middle, and between middle and high-middle frequency range.

In order to achieve this object, an audio signal waveform emphasis processing device according to the present invention comprises integration means comprising one or a plurality of even-order integrators for performing integration of even-numbered order on an input audio signal; differentiation means comprising one or a plurality of even-order differentiators for performing differentiation of even-numbered order on the input audio signal; and addition means for adding output of the integration means and output of the differentiation means to the input audio signal in the same phase or in reverse-phase with the input audio signal.

The integration means may comprise a plurality of double integrators for performing successive double integration on the input audio signal; the differentiation means comprises a plurality of double differentiators for performing successive double differentiation on the input audio signal; and the addition means comprises a plurality of first coefficient means for respectively multiplying outputs of a plurality of the double integrators by a first coefficient; a first adder for adding outputs of a plurality of the first coefficient means; a plurality of second coefficient means for respectively multiplying outputs of a plurality of the double differentiators by a second coefficient; a second adder for adding outputs of a plurality of the second coefficient means; third coefficient means for multiplying output of the first adder by a third coefficient; fourth coefficient means for multiplying output of the second adder by a fourth coefficient; and a third adder for adding output of the third coefficient means and output of the fourth coefficient means to the input audio signal.

In the audio signal waveform emphasis processing device according to the present invention, a first group of coefficients including the first coefficient with which multiplication is effected by the first coefficient means and a second group of coefficients including the second coefficient with which multiplication is effected by the second coefficient means may be determined in correspondence with a desired frequency-gain characteristic.

The third coeffcient with which multiplication is effected by the third coefficient means may be determined in accordance with the degree of emphasis in a low frequency range of the input audio signal, and the fourth coefficient with which multiplication is effected by the fourth coefficient means is determined in accordance with the degree of emphasis in the high frequency range of the input audio signal.

The integration means may comprise a single double integrator; the differentiation means comprises a single double differentiator, and the addition means comprises an adder for inverting output of the single double integrator and output of the single double differentiator, obtaining signals by respectively multiplying these inverted outputs by arbitrary coefficients and adding the signals to the input audio signal.

Also, an audio signal waveform emphasis processing device may comprise a plurality of cascade-connected double integrating circuits for performing successive double integration on an input audio signal; a plurality of cascade-connected double differentiating circuits that perform successive double differentiation on the input audio signal; a plurality of first coefficient generators for multiplying a first coefficient respectively with outputs of even-numbered double integrating circuits of the plurality of double integrating circuits; a first addition circuit for inverting and adding outputs of the plurality of the first coefficient generators; a plurality of second coefficient generators for respectively multiplying a second coefficient with outputs of odd-numbered double integration circuits of the plurality of the double integration circuits; a second addition circuit for inverting and adding outputs of the plurality of the second coefficient generators and output of the first addition circuit;

a third coefficient generator for multiplying a third coefficient with the output of the first addition circuit; a fourth coefficient generator for multiplying a fourth coefficient with output of the second addition circuit; and a third addition circuit for adding output of the third coefficient generator and output of the fourth coefficient generator to the input audio signal.

Also, an audio signal waveform emphasis processing device may comprise a waveform emphasis circuit consisting solely of passive elements, for emphasizing waveform in a low frequency range and a high frequency range of an input audio signal; an addition circuit for adding output of the waveform emphasis circuit and the input audio signal; and variation means for controlling ratio of the output of the waveform emphasis circuit to be added by the addition circuit and the input audio signal.

Further, an audio signal waveform emphasis processing method may comprise a first step of performing even-order integration on an input audio signal; a second step of performing even-order differentiation on the input audio signal; and a third step of adding the even-order integrated input audio signal produced in the first step and the even-order differentiated input audio signal produced in the second step to the input audio signal.

The first step may comprise a step of performing double integration on the input audio signal successively a plurality of times; the second step comprises a step of performing double differentiation on the input audio signal successively a plurality of times; and the third step comprises: a fourth step of multiplying a first coefficient respectively with values obtained by double integration each of the plurality of times in the first step; a fifth step of adding the double-integrated values that are multiplied by the first coefficient in the fourth step; a sixth step of multiplying a second coefficient respectively with values obtained by double differentiation each of the plurality of times in the second step; a seventh step of adding the double-differentiated values that are multiplied by the second coefficient in the sixth step; and an eighth step of multiplying a third coefficient and a fourth coefficient respectively with the sum that is obtained by the addition in the fifth step and the sum that is obtained by the addition in the seventh step, and adding results to the input audio signal.

Also, a first coefficient group containing the first coefficient and second coefficient group containing the second coefficient may be determined in accordance with a desired frequency-gain characteristic.

Also, the third coefficient and fourth coefficient may be determined in accordance with the degree of emphasis in a low frequency range and a high frequency range of the input audio signal.

DESCRIPTION OF THE PREFERRED EMBODIMENTS

Embodiments of an audio signal waveform emphasis processing device and method according to the present invention are described in detail below with reference to the appended drawings.

Figure 1:
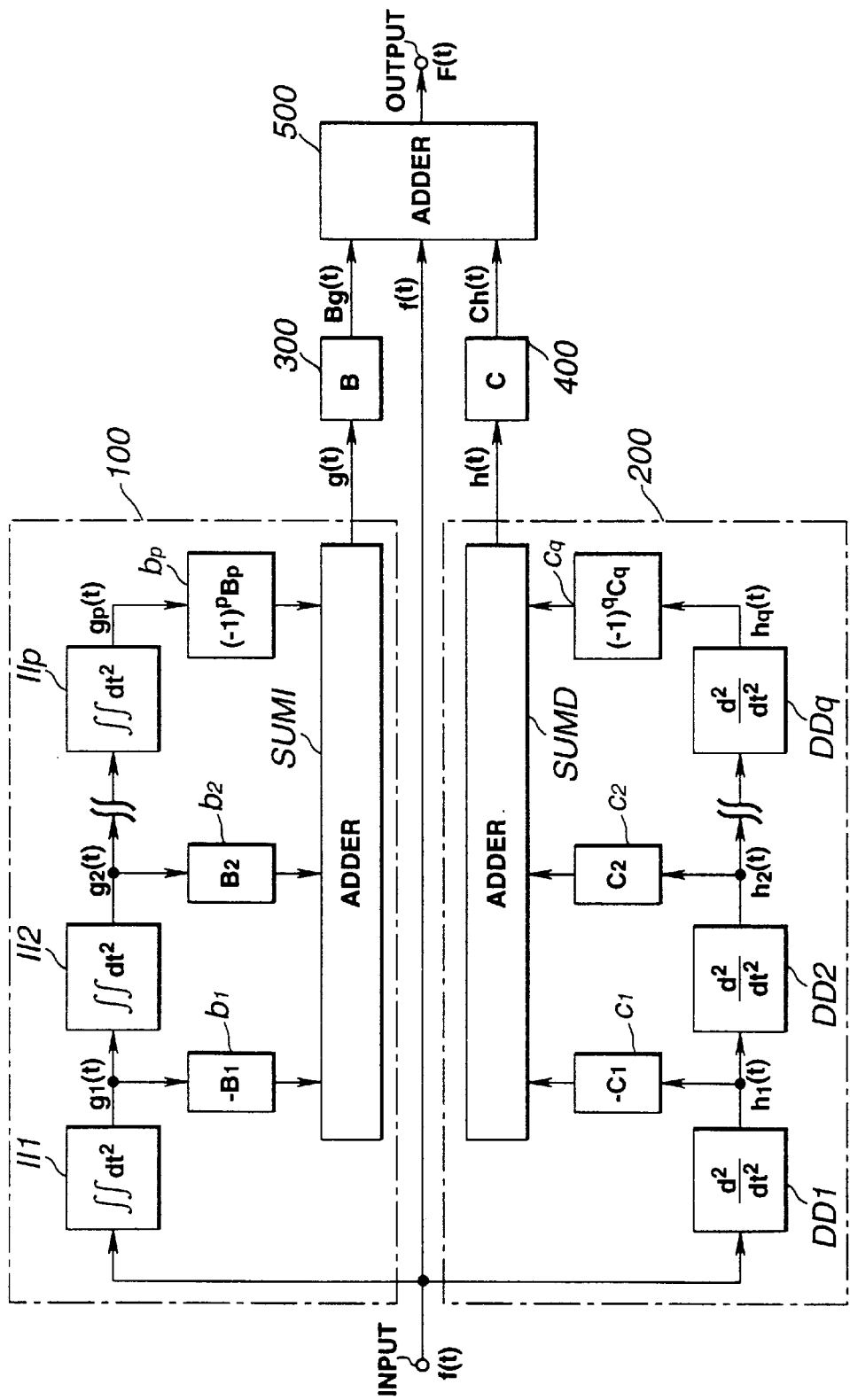
FIG. 1 is a block diagram illustrating a typical configuration of an audio signal waveform emphasis processing device according to the present invention.

FIG. 1 is a block diagram showing a diagrammatic configuration of an embodiment of an audio signal waveform emphasis processing device which for obtaining a preferred frequency-gain characteristic in which the high frequency range and low frequency range are emphasized as desired without destroying the mutual phase relationship between the frequency components of the middle frequency range and the frequency components of the low frequency range and high frequency range close to the middle frequency range of the original audio signal.

Referring to FIG. 1, the audio signal waveform emphasis processing device comprises a low frequency range emphasis processing section 100 that performs emphasis processing on the low frequency range of an original signal f(t), which is a function of time t and applied to input terminal INPUT; high frequency range emphasis processing section 200 that performs emphasis processing on the high frequency range of original signal f(t) applied to input terminal INPUT; a coefficient generator 300 that determines the degree of emphasis of the low frequency range by multiplying by an overall coefficient B the low frequency range emphasized signal g(t) that was subjected to emphasis processing on the low frequency range by means of the low frequency range emphasis processing section 100 so as to output Bg(t); a coefficient generator 400 that determines the degree of emphasis of the high frequency range by multiplying by an overall coefficient C the high frequency range emphasized signal h(t) that was subjected to high frequency range emphasis processing by means of high frequency range emphasis processing section 200 so as to outputting Ch(t); andan adder 500 that adds the signal Bg(t) output from coefficient generator 300 whose low frequency range was emphasized, the original signal f(t) applied to input terminal INPUT and the signal Ch(t) output from coefficient generator 400 whose high frequency range has been emphasized so as to output an output signal F(t) through output terminal OUTPUT.

Low frequency range emphasis processing section 100 comprises a plurality of double integrators II1, II2, ..., II$p$ that output intermediate signals g1(t), g2(t), ..., g$p$(t) by successively double-integrating original signal f(t) that is applied at input terminal INPUT; a plurality of coefficient generators b1, b2, ..., b$p$ that respectively multiply by coefficients –B1, B2, ..., $(-1)^p$B$p$ that are set beforehand intermediate signals g1(t), g2(t), ..., g$p$(t) that are output from double integrators II1, II2, ..., II$p$; and an adder SUMI that outputs a low frequency range emphasized signal g(t) obtained by adding the outputs of coefficient generators b1, b2, ..., b$p$.

The group of coefficients B1, B2, ..., B$p$ that are used as multipliers by coefficient generators b1, b2, ..., b$p$ are determined in accordance with the desired frequency-phase characteristic and may have negative as well as positive values.

High frequency range emphasis processing section 200 comprises a plurality of double differentiators DD1, DD2, ..., DD$q$ that output intermediate signals h1(t), h2(t), ..., h$q$(t) obtained by successive double differentiation of the original signal f(t) that is applied to input terminal INPUT; a plurality of coefficient generators c1, c2, ..., c$q$ that respectively multiply by coefficients –C1, C2, ..., $(-1)^q$C$q$ that are set beforehand the intermediate signals h1(t), h2(t), ..., h$q$(t) that are output from double differentiators DD1, DD2, ..., DD$q$; and adder SUMD that outputs the high frequency range emphasized signal h(t) obtained by adding the outputs of coefficient generators c1, c2, ..., c$q$.

It should be noted that the group of coefficients C1, C2, ..., C$q$ that are applied as multipliers by coefficient generators c1, c2, ..., c$q$ are determined in accordance with the desired frequency-phase characteristic as will be described later, and may have negative as well as positive values.

The principles of the low frequency emphasis processing action of low frequency emphasis processing section 100 will now be described.

Since the original signal f(t) that is applied to input terminal INPUT is an audio signal, in general it contains a plurality of frequency components. The principles of the present invention may therefore be explained by expressing the original signal f(t) as:

$$f(t)=A1\ \mathrm{Sin}(\omega 1t+\theta 1)+A2\ \mathrm{Sin}(\omega 2t+\theta 2)+ \ldots +An\ \mathrm{Sin}(\omega nt+\theta n) \quad (1)$$

where A1, A2, ..., An respectively represent the amplitudes of the frequency components constituting the original signal f(t); $\omega 1$, $\omega 2$, ..., $\omega n$ respectively represent the angular velocities of the frequency components constituting the original signal f(t), and $\theta 1$, $\theta 2$, ..., $\theta n$ respectively represent the phase angles of the frequency components constituting the original signal f(t).

The equation (1) may be expressed as follows in matrix notation:

$$f(t) = \begin{bmatrix} A1 \\ A2 \\ \vdots \\ An \end{bmatrix} [\mathrm{Sin}(\omega 1t + \theta 1), \mathrm{Sin}(\omega 2t + \theta 2), \cdots, \mathrm{Sin}(\omega nt + \theta n)] \quad (2)$$

Original signal f(t) represented by equation (1) is first of all subjected to double integration in double integrator II1. Consequently, the intermediate signal g1(t) that is output from double integrator II1 is:

$$g1(t) = -\begin{bmatrix} A1\omega 1^{-2} \\ A2\omega 2^{-2} \\ \vdots \\ An\omega n^{-2} \end{bmatrix} [\mathrm{Sin}(\omega 1t + \theta 1), \mathrm{Sin}(\omega 2t + \theta 2), \cdots, \mathrm{Sin}(\omega nt + \theta n)] \quad (3)$$

As can be seen by comparing equation (2) with equation (3) the term that is represented by the frequency component and phase component of intermediate signal g1(t) that is output from double integrator II1 is identical with the term that is expressed by the frequency component and phase component of original signal f(t). Consequently, it can be seen that intermediate signal g1(t) that is output from double integrator II1 maintains unchanged the mutual phase relationship between the frequency components of original signal f(t).

The amplitudes of the respective frequency components of intermediate signal g1(t) that is output from double integrator II1 have values that are inversely proportional to the square of the angular frequency, namely, a value obtained by dividing A1 by the square of $\omega$, a value obtained by dividing A2 by the square of $\omega$, and so forth. That is, the amplitude of each frequency component of intermediate signal g1(t) that is output from double integrator II1 increases in inverse proportion to the square of the angular velocity as the angular velocity becomes lower.

The intermediate signal g1(t) that is output from double integrator II1 is again double-integrated by double integrator II2, so that the intermediate signal g2(t) that is output from the double integrator II2 is:

$$g2(t) = \begin{bmatrix} A1\omega1^{-4} \\ A2\omega2^{-4} \\ \vdots \\ An\omega n^{-4} \end{bmatrix} [\text{Sin}(\omega 1t + \theta 1), \text{Sin}(\omega 2t + \theta 2), \cdots, \text{Sin}(\omega nt + \theta n)] \quad (4)$$

As can be seen by comparing equation (2) with equation (4) the term that is expressed by the frequency component and phase component of intermediate signal g2(t) that is output from double integrator II2 and the term that is expressed by the frequency component and the phase component of original signal f(t) are identical. It can therefore be seen that the intermediate signal g2(t) that is output from double integrator II2 maintains unaltered the mutual phase relationships of the frequency components of original signal f(t).

The amplitudes of the frequency components of the intermediate signal g2(t) that is output from double integrator II2 have values inversely proportional to the 4th power of the angular velocity ω, namely, a value obtained by dividing A1 by the 4th power of ω, a value obtained by dividing A2 by the 4th power of ω, and so forth. In other words, the amplitude of each frequency component of intermediate signal g2(t) that is output from double integrator II2 increases in inverse proportion to the 4th power of the angular velocity as the angular velocity becomes lower.

Thus, the intermediate signal gp(t) that is output from double integrator Iip is:

$$gp(t) = \qquad (5)$$

$$(-1)^p \begin{bmatrix} A1\omega1^{-2p} \\ A2\omega2^{-2p} \\ \vdots \\ An\omega n^{-2p} \end{bmatrix} [\text{Sin}(\omega 1t + \theta 1), \text{Sin}(\omega 2t + \theta 2), \cdots, \text{Sin}(\omega nt + \theta n)]$$

As can be seen by comparing equation (2) with equation (5), the term which is represented by the frequency component and the phase component of intermediate signal gp(t) that is output from double integrator Iip is identical with the term that is expressed by the frequency component and phase component of original signal f(t). It can therefore be seen that, in the intermediate signal gp(t) that is output from double integrator I$p$, the mutual phase relationship of the frequency components of original signal f(t) is maintained unaltered.

Also, the amplitudes of the frequency components of intermediate signal gp(t) that is output from double integrator Iip have values inversely proportional to the power 2p of the angular velocity, namely, a value obtained by dividing A1 by ω raised to the power 2p, a value obtained by dividing A2 by ω raised to the power 2p, and so forth. In other words, the amplitudes of the frequency components of intermediate signal gp(t) that is output from double integrator Iip increase in inverse proportion to the power 2p of the angular velocity as the angular velocity becomes lower.

The intermediate signals g1(t), g2(t), . . . , g$p$(t) shown in the equations (3) to (5) that are respectively output from double integrators II1, II2, . . . , I$ip$ are respectively multiplied by pre-set coefficients −B1, B2, . . . , (−1)$^p$B$p$ by coefficient generators b1, b2, . . . , b$p$ and added by adder SUM1.

Consequently, the low frequency range emphasized signal g(t) that is output from adder SUM1 is:

$$g(t) = -B1g1(t) + B2g2(t) - \ldots + (-1)^p Bpgp(t) \quad (6)$$

In other words, the low frequency range emphasized signal g(t) is expressed as he following equation (7) in which in order to simplify the explanation, −B1 is replaced with B1 and (−1)$^p$B$p$ is replaced with B$p$.

$$g(t) = \begin{bmatrix} A1 \sum_{j=1}^{p} Bj\omega1^{-2j} \\ A2 \sum_{j=1}^{p} Bj\omega2^{-2j} \\ \vdots \\ An \sum_{j=1}^{p} Bj\omega n^{-2j} \end{bmatrix} [\text{Sin}(\omega 1t + \theta 1),$$

$$\text{Sin}(\omega 2t + \theta 2), \cdots, \text{Sin}(\omega nt + \theta n)] \quad (7)$$

As can be seen by comparing equation (2) with equation (7), the term of the low frequency range emphasized signal g(t) expressed by the frequency component and the phase component is identical with the term of the original signal f(t) expressed by the frequency component and phase component, so in the low frequency range emphasized signal g(t) the mutual phase relationship of the frequency components of the original signal f(t) is preserved unchanged.

The term that expresses the frequency components of the low frequency range emphasized signal g(t) contains no resonance pole. This is a reason why, as a result of the sound quality improvement of the present invention, a natural sound quality is obtained with no specific resonance in the low frequency range.

Next, the principles of operation of high frequency range emphasis processing by high frequency range emphasis processing section 200 will be described below. The original signal f(t) indicated by equation (1) and applied to input terminal INPUT is first of all subjected to double differentiation by double differentiator DD1. The intermediate signal h1(t) that is output from double differentiator DD1 in this case is therefore:

$$h1(t) = -\begin{bmatrix} A1\omega 1^2 \\ A2\omega 2^2 \\ \vdots \\ An\omega n^2 \end{bmatrix} [\text{Sin}(\omega 1t + \theta 1), \text{Sin}(\omega 2t + \theta 2), \cdots, \text{Sin}(\omega nt + \theta n)] \quad (8)$$

As is clear by comparing equation (2) with equation (8), the term expressed by the frequency component and phase component of intermediate signal h1(t) that is output from double differentiator DD1 is identical with the term expressed by the frequency component and phase component of original signal f(t) In the intermediate signal h1(t) that is output from double differentiator DD1, the mutual phase relationship of the frequency components of original signal f(t) is therefore preserved unchanged.

The amplitudes cf the frequency components of intermediate signal h1(t) that is output from double differentiator DD1 have values proportional to the square of the angular velocity ω, namely, a value obtained by multiplying A1 by the square of ω, a value obtained by multiplying A2 by the square of ω, and so forth. In other words, the amplitude of the frequency components of intermediate signal h1(t) that is output from double differentiator DD1 increases in proportion to the square of the angular velocity as the angular velocity becomes higher.

The intermediate signal h1(t) that is output from double differentiator DD1 is again subjected to double differentiation by double differentiator DD2, so the intermediate signal h2(t) that is output from the double differentiator DD1 is:

$$h2(t) = \begin{bmatrix} A1\omega1^4 \\ A2\omega2^4 \\ \vdots \\ An\omega n^4 \end{bmatrix} [\text{Sin}(\omega 1t + \theta 1), \text{Sin}(\omega 2t + \theta 2), \cdots, \text{Sin}(\omega nt + \theta n)] \quad (9)$$

As can be seen by comparing equation (2) with equation (9), the term that is expressed by the frequency component and phase component of intermediate signals h2(t) that is output from double differentiator DD2 is identical with the term expressed by the frequency component and phase component of original signal f(t) It can therefore be seen that the intermediate signal h2(t) that is output from double differentiator DD2 likewise preserves unchanged the mutual phase relationship of the frequency components of original signal f(t).

The amplitudes of the frequency components of the intermediate signal h2(t) that is output from double differentiator DD2 have values proportional to the 4th power of the angular velocity $\omega$, namely, a value obtained by multiplying A1 by the 4th power of $\omega$, a value obtained by multiplying A2 by the 4th power of $\omega$, and so forth. In other words, the amplitude of the frequency components of the intermediate signal h2(t) that is output from double differentiator DD2 increases in proportion to the 4th power of the angular velocity as the angular velocity becomes higher.

Likewise, intermediate signal hq(t) that is output from double differentiator Ddq is:

$$hq(t) = \quad (10)$$
$$(-1)^q \begin{bmatrix} A1\omega1^{2q} \\ A2\omega2^{2q} \\ \vdots \\ An\omega n^{2q} \end{bmatrix} [\text{Sin}(\omega 1t + \theta 1), \text{Sin}(\omega 2t + \theta 2), \cdots, \text{Sin}(\omega nt + \theta n)]$$

As will be clear from comparison of equation (2) with equation (10), the term that is expressed by the frequency component and phase component of intermediate signal hg$^q$(t) that is output from double differentiator Ddq is identical with the term expressed by the frequency component and phase component of original signal f(t) It can therefore be seen that the intermediate signal hq(t) that is output from double differentiator Ddq preserves unchanged the mutual phase relationship of the frequency components of original signal f(t)

The amplitudes of the frequency components of intermediate signal hq(t) that is output from double differentiator Ddq have values proportional to the power $2^q$ of the angular velocity, namely, a value obtained by multiplying A1 by $\omega$ raised to the power $2^q$, a value obtained by multiplying A2 by $\omega$ raised to the power $2^q$ and so forth. In other words, the amplitude of the frequency components of intermediate signal hq(t) that is output from double differentiator II$^q$ increases in proportion with the angular velocity raised to the power $2^q$ as the angular velocity becomes higher.

The intermediate signals h1(t), h2(t), . . . , hq(t) indicated by the equations (8) to (10) and output from double differentiators DD1, DD2, . . . , Ddq are respectively multiplied by coefficients –C1, C2, . . . , $(-1)^q Cq$ that were set beforehand, in coefficient generators c1, c2, . . . , cq, and then added by adder SUMD.

The high frequency range emphasized signal h(t) that is output from adder SUMD is therefore:

$$h(t) = -C1h1(t) + C2h2(t) - \ldots + (-1)^q Cqhq(t) \quad (11)$$

That is, the high frequency range emphasized signal h(t) is expressed by the following equation (12) in which in order to simplify the explanation, –C1 is replaced with C1 and $(-1)^q Cq$ is replaced with Cq.

$$h(t) = \begin{bmatrix} A1 \sum_{j=1}^{q} Cj\omega 1^{2j} \\ A2 \sum_{j=1}^{q} Cj\omega 2^{2j} \\ \vdots \\ An \sum_{j=1}^{q} Cj\omega n^{2j} \end{bmatrix} [\text{Sin}(\omega 1t + \theta 1), \quad (12)$$

$$\text{Sin}(\omega 2t + \theta 2), \cdots, \text{Sin}(\omega nt + \theta n)]$$

Consequently, as will be clear by comparing equation (2) with equation (12), the term that is expressed by the frequency component and phase component of high frequency range emphasized signal h(t) is identical with the term that is expressed by the frequency component and phase component of original signal f(t), so the high frequency range emphasized signal h(t) preserves unaltered the mutual phase relationships of the frequency components of the original signal f(t).

The term that expresses the frequency components of high frequency range emphasized signal h(t) contains noresonance pole. This fact is the reason why a natural sound quality with no specific resonance is obtained in the high frequency range as a result of the sound quality improvement of the present invention.

After the low frequency range emphasized signal g(t) represented by equation (7) has been subjected to low frequency range emphasis processing as described above in low frequency range emphasis processing section 100, it is multiplied by overall coefficient B that determines the degree of low frequency range emphasis in coefficient generator 300 and supplied as low frequency range signal Bg(t) to adder 500.

High frequency range emphasized signal h(t) represented by equation (12) that has been subjected to high frequency range emphasis processing as described above in high frequency range emphasis processing section 200 is multiplied by overall coefficient C that determines the degree of high frequency range emphasis in coefficient generator 600 and is applied to adder 500 as high frequency range signal Ch(t).

The original signal f(t) represented by equation (1), which was applied at input terminal INPUT, is applied directly to adder 500. Adder 500 adds the low frequency range signal Bg(t) and high frequency range signal Ch(t) and original signal f(t) referred to above, and outputs the result to output terminal OUTPUT as output signal F(t). The output signal F(t) that is output to output terminal OUTPUT is therefore:

$$F(t) = Bg(t) + f(t) + Ch(t) \quad (13)$$

The output signal F(t) that is output at output terminal OUTPUT is therefore:

$$h(t) = \begin{bmatrix} A1\left(1 + B\sum_{j=1}^{p} Bj\omega 1^{-2j} + C\sum_{k=1}^{q} Ck\omega 1^{2k}\right) \\ A2\left(1 + B\sum_{j=1}^{p} Bj\omega 2^{-2j} + C\sum_{k=1}^{q} Ck\omega 2^{2k}\right) \\ \vdots \\ An\left(1 + B\sum_{j=1}^{p} Bj\omega n^{-2j} + C\sum_{k=1}^{q} Ck\omega n^{2k}\right) \end{bmatrix} [\sin(\omega 1 t + \theta 1),$$

$$\sin(\omega 2t + \theta 2), \cdots, \sin(\omega nt + \theta n)] \quad (14)$$

It can be seen by comparing the equation (14) with equation (2) that the term expressed by the frequency component and phase component of the output signal F(t) is identical with the term expressed by the frequency component and phase component of original signal f(t), so the output signal F(t) preserves as unaltered the mutual phase relationships of the frequency components of original signal f(t). Naturally, in the equation (14), if we assume that B=0 and C=0, output signal F(t) is the same as the original signal f(t).

By extracting from equation (14) only the amplitude terms, we have:

$$h(t) = \begin{bmatrix} A1\left(1 + B\sum_{j=1}^{p} Bj\omega 1^{-2j} + C\sum_{k=1}^{q} Ck\omega 1^{2k}\right) \\ A2\left(1 + B\sum_{j=1}^{p} Bj\omega 2^{-2j} + C\sum_{k=1}^{q} Ck\omega 2^{2k}\right) \\ \vdots \\ An\left(1 + B\sum_{j=1}^{p} Bj\omega n^{-2j} + C\sum_{k=1}^{q} Ck\omega n^{2k}\right) \end{bmatrix} [1, 1, \cdots, 1] \quad (15)$$

If the respective coefficients associated with values A1, A2, ..., An representing the amplitude of the frequency components of the original signal are plotted on respective frequency axes, the frequency-gain characteristic of the audio signal waveform emphasis processing circuit can be obtained.

Figure 2:
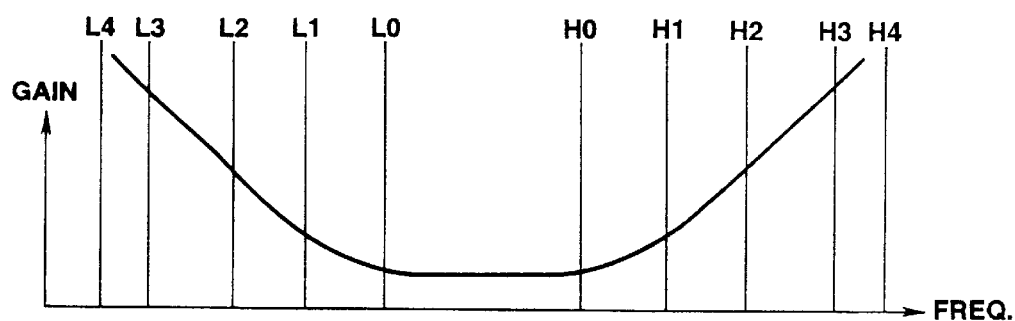
FIG. 2 is a view showing an example of the frequency-gain characteristic obtained with the audio signal waveform emphasis processing device illustrated in FIG. 1.

FIG. 2 shows an example of the frequency-gain characteristic of the audio signal waveform emphasis processing circuit shown in FIG. 1, which is obtained by suitably selecting coefficients B1, B2, ..., B$p$, B, C1, C2, ..., C$q$, and C in accordance with equation (15).

As is clear from FIG. 2, the frequency-gain characteristic of the audio signal waveform emphasis processing device is flat in the middle frequency range. In the low frequency range, the gain increases as the frequency becomes lower, while, in the high frequency range, the gain increases as the frequency becomes higher.

Coefficients B1, B2, ..., B$p$ and C1, C2, ..., C$q$ can be found by solving the following linear simultaneous equations with number of unknowns n=p+q indicated below.

$$\begin{cases} V1 = 1 + B\sum_{j=1}^{p} Bj\omega 1^{-2j} + C\sum_{k=1}^{q} Ck\omega 1^{2k} \\ V2 = 1 + B\sum_{j=1}^{p} Bj\omega 2^{-2j} + C\sum_{k=1}^{q} Ck\omega 2^{2k} \\ \vdots \\ Vn = 1 + B\sum_{j=1}^{p} Bj\omega n^{-2j} + C\sum_{k=1}^{q} Ck\omega n^{2k} \end{cases} \quad (16)$$

where V1, V2, ..., V$n$ are expected values of the gain corresponding to angular frequencies $\omega$1, $\omega$1, ..., $\omega$n on the desired frequency-gain characteristic.

The simultaneous equations (16) have no general solution, but solution can be obtained under certain conditions.

In the simplest case, by putting p+q=n in the simultaneous equations (16), coefficients B1, B2, ..., B$p$ and C1, C2, ..., C$q$ can be uniquely found.

For example, in the configuration of FIG. 1, if p=q=1, in other words, in the case where double integrators II1, II2, ..., II$p$ and double differentiators DD1, DD2, ..., D$dq$, are respectively of single-stage construction, by setting two expected points V1, V2, coefficients B1 and C1 can be uniquely obtained by solving the linear simultaneous equations with two unknowns:

$$\begin{cases} V1 = 1 + B1\omega 1^{-2} + C1\omega 1^{2} \\ V2 = 1 + B1\omega 2^{-2} + C1\omega 2^{2} \end{cases} \quad (17)$$

Also, in for example the configuration of FIG. 1, if p=q=4, in other words, in the case where double integrators II1, II2, ..., II$p$ and double differentiators DD1, DD2, ..., D$dq$ are respectively of 4-stage construction, the coefficients B1, B2, B3, B4 and C1, C2, C3, C4 can be uniquely found by solving the linear simultaneous equations with 8 unknowns if the eight expected points V1, V2, ..., V8 are set.

$$\begin{cases} V1 = 1 + B\sum_{j=1}^{4} Bj\omega 1^{-2j} + C\sum_{k=1}^{4} Ck\omega 1^{2k} \\ V2 = 1 + B\sum_{j=1}^{4} Bj\omega 2^{-2j} + C\sum_{k=1}^{4} Ck\omega 2^{2k} \\ \vdots \\ V8 = 1 + B\sum_{j=1}^{4} Bj\omega 8^{-2j} + C\sum_{k=1}^{4} Ck\omega 8^{2k} \end{cases} \quad (18)$$

In other arbitrary cases, a general solution cannot be obtained, but approximate solutions and special solutions can be obtained.

In the configuration of FIG. 1, if p=q=1, in other words, in the case where double integrators II1, II2, ..., II$p$ and double differentiators DD1, DD2, ..., DD$q$ are respectively of single-stage construction, output signal F(t) is:

$$h(t) = \begin{bmatrix} A1(1 + B\omega 1^{-2} + C\omega 1^2) \\ A2(1 + B\omega 2^{-2} + C\omega 2^2) \\ \vdots \\ An(1 + B\omega n^{-2} + C\omega n^2) \end{bmatrix} [\text{Sin}(\omega 1 t + \theta 1),$$

$$\text{Sin}(\omega 2t + \theta 2), \cdots, \text{Sin}(\omega nt + \theta n)]$$

(19)

The audio signal waveform emphasis processing device with double integrators and double differentiators of this construction is an example which exhibits highest cost-performance.

Incidentally, in equation (14), if coefficients B1, B2, ..., B$p$ and coefficients C1, C2, ..., C$q$ are all positive, output signal F(t) diverges as the angular velocity ω approaches 0. Likewise, in equation (14), the output signal F(t) diverges when the angular velocity ω becomes large.

Therefore, in the configuration of FIG. 1, there is an unwanted increase in gain in the very low frequency range (below about 50 Hz) and very high frequency range (above about 6,000 Hz): this is not appropriate in practical use.

Accordingly, in a practical circuit configuration, in order to ensure that the gain does not diverge in frequency ranges that are entirely unnecessary in respect of the audio signal, a configuration may be adopted in which the signs of coefficients B1, B2, ..., B$p$ and coefficients C1, C2, ..., C$q$ are appropriately selected or a cut-off filter is employed. The location where such a cut-off filter is to be inserted is determined taking into account the dynamic range and/or S/N ratio of the actual device configuration and/or during calculation process.

In the audio signal waveform emphasis method of the present invention, coefficients B1, B2, ..., B$p$ and C1, C2, ..., C$q$ that can accurately satisfy a frequency-gain characteristic of any arbitrary form do not in general exist. However, this fact does not impair the effectiveness of the present invention.

The present invention lies in ensuring mutually in-phase characteristics between frequency components in a practically important frequency range using a very straightforward principle; its essence does not lie in obtaining a general solution for arbitrary requirements.

Although the present invention is inappropriate for satisfying fine emphasis characteristics, it makes it possible to cope with characteristic compensation of electro-mechanical systems such as microphones and/or speakers, compensation for sound wave propagation characteristics in air, compensation for sensitivity of auditory perception, and environmental effects etc. over a wide range, by a simple adjustment (for example adjustment of overall coefficients B and C). This is one of the main features of the present invention.

Also, with the sound quality emphasis of the present invention, since no resonance occurs in the entire frequency range, a natural sound quality is obtained with no unusual characteristics even though emphasis is performed in the low frequency range and/or high frequency range.

It is generally said that, in audio engineering, the characteristics of the time-axis waveform of the audio signal are not considered to be important in respect of sound quality, but, in practice, it is known that they affect tone characteristics.

Whether the waveform characteristic on the time axis affects sound quality or not is not of the essence of the present invention. The essence of the present invention lies in emphasizing the characteristic of the waveform on the time axis without destroying the waveform characteristics of the audio signal.

With regard to the specific techniques of integration, differentiation and addition etc. of the audio signal, any technique, whether of the analogue type or digital type, may be employed.

An arbitrary audio signal in a given time zone can be represented by a Fourier series without loss of generality in practice. The frequency components and phase components of a series obtained by applying integration of even-numbered degree and differentiation of even-numbered degree on such a Fourier series are in-phase and reverse-phase with respect to the signal components of the original signal. Since it is known whether any term of this series is in-phase or reverse-phase, it is therefore possible to obtain a target frequency-gain characteristic by adding the frequency components obtained by multiplying by a group of appropriate coefficients, the signal obtained by applying even-order differentiation and integration in the necessary frequency region.

Figure 3:
FIG. 3 is a view showing the frequency-phase characteristic of the audio signal waveform emphasis processing device illustrated in FIG. 1 when the frequency-gain characteristic shown in FIG. 2 is realized.

FIG. 3 shows the frequency-phase characteristic of an audio signal waveform emphasis processing device shown in FIG. 1 when the frequency-gain characteristic shown in FIG. 2 is realized. It can be seen that, with the frequency-phase characteristic shown in FIG. 3, the phase distortion of the output signal F(t) with respect to original signal f(t) is 0° in the effective frequency range.

Figure 4:
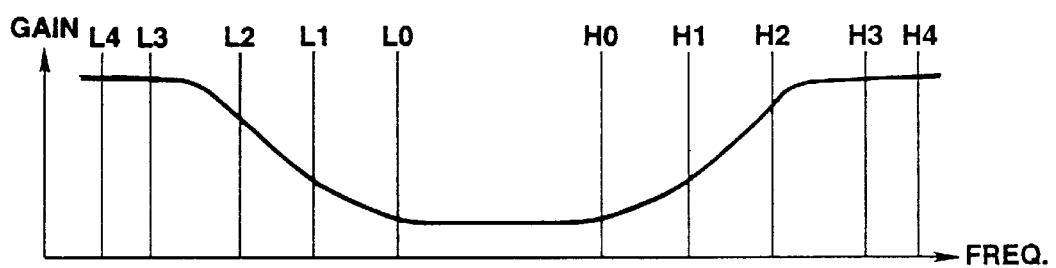
FIG. 4 is a view showing the frequency-gain characteristic of a practical embodiment wherein the drawback that the frequency-gain characteristic shown in FIG. 2 has large gain within an unnecessary frequency range is compensated.

FIG. 4 shows the frequency-gain characteristic of a practical embodiment in which the drawback that the frequency-gain characteristic shown in FIG. 2 has large gain in unnecessary frequency ranges is compensated. Such a frequency-gain characteristic can be implemented by employing a low frequency cut-off filter such that gain is not increased in a frequency range below a frequency L3 and employing a high frequency cut-off filter such that the gain does not increase in a frequency range above a frequency H3.

Figure 5:
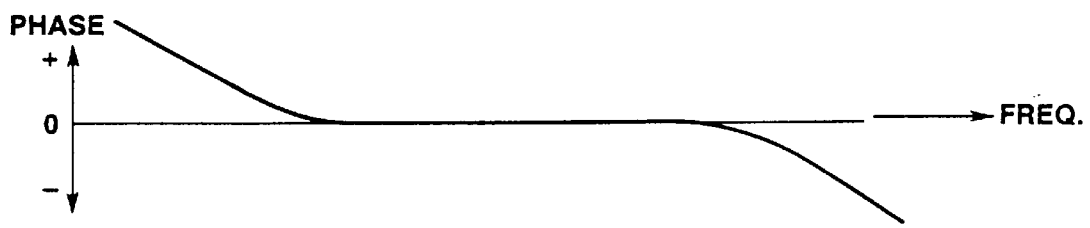
FIG. 5 is a view showing the frequency-phase characteristic of the audio signal waveform emphasis processing device shown in FIG. 1 when the frequency-gain characteristic shown in FIG. 4 is realized.

FIG. 5 shows the frequency-phase characteristic of the audio signal waveform emphasis processing device shown in FIG. 1 in which the frequency-gain characteristic shown in FIG. 4 is realized.

In general, if the low frequency range is cut off by a low frequency cut-off filter, the phase in the low frequency range is lead and, if the high frequency range is cut off by a high frequency cut-off filter, the phase in the high frequency range is lagged.

If therefore a frequency-gain characteristic as shown in FIG. 4 is to be achieved, the constants of the low frequency cut-off filter and high frequency cut-off filter are determined such that the frequency ranges where phase distortion occurs are beyond L3 and H3, in order to ensure that phase distortion does not occur in the effective audio frequency range.

Figure 6:
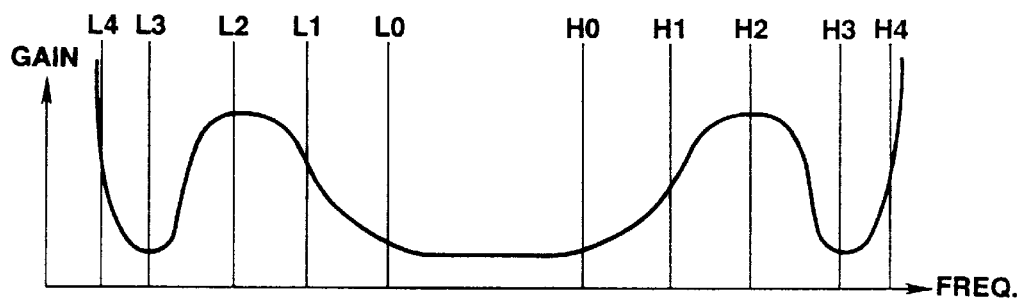
FIG. 6 is a view showing an example of the frequency-gain characteristic obtained with the audio signal waveform emphasis processing device shown in FIG. 1.
Figure 8:
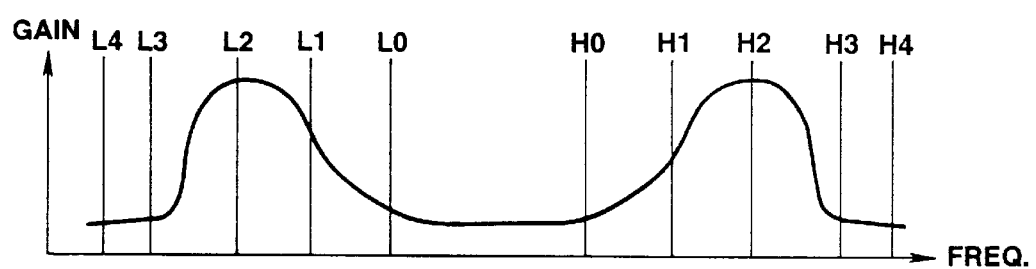
FIG. 8 is a view showing the frequency-gain characteristic of a practical embodiment when the drawback that the frequency-gain characteristic shown in FIG. 6 has large gain in an unnecessary frequency range is compensated.

FIG. 6 shows an example of the frequency-gain characteristic obtained by an audio signal waveform emphasis processing device as shown in FIG. 1 in which the frequency-gain characteristic shown in FIG. 8 is realized.

The frequency-gain characteristic shown in FIG. 6 can be obtained by setting p=q=5 or so in the configuration shown in FIG. 1. The frequency-gain characteristic shown in FIG. 6 is characterized in that the gain drops down in the vicinity of frequencies L3 and H3.

Figure 7:
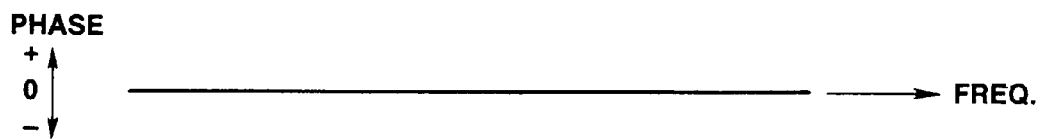
FIG. 7 is a view showing the frequency-phase characteristic of the audio signal waveform emphasis processing circuit shown in FIG. 1 when the frequency-gain characteristic shown in FIG. 6 is realized.

FIG. 7 shows the frequency-phase characteristic of the audio signal waveform emphasis processing device shown in FIG. 1 in which the frequency-gain characteristic shown in FIG. 6 is realized. The frequency-phase characteristic in FIG. 7 shows that the phase distortion of the output signal F(t) with respect to the original signal f(t) is 0° in the effective frequency range.

However, in this case also, as shown in FIG. 6, the gain increases rapidly below frequency L4 and above frequency H4, so this is still unsuitable for practical application. A low frequency cut-off filter and a high frequency cut-off filter are therefore provided to respectively cut off the unnecessary low frequency range below frequency L4 and the unnecessary high frequency range above frequency H4.

FIG. 8 shows the frequency-gain characteristic of a practical embodiment wherein the drawback that the frequency-gain characteristic shown in FIG. 6 has large gain in unnecessary frequency ranges is compensated. This frequency-gain characteristic can be implemented by employing a low frequency cut-off filter such that the gain does not increase in the range below frequency L3 and by employing a high frequency cut-off filter such that the gain does not increase in the range above frequency H3.

Figure 9:
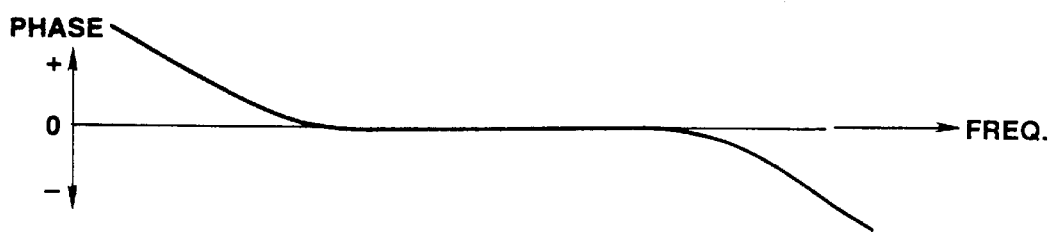
FIG. 9 is a view showing the frequency-phase characteristic of the audio signal waveform emphasis processing device shown in FIG. 1 when the frequency-gain characteristic shown in FIG. 8 is realized.

FIG. 9 shows the frequency-phase characteristic of the audio signal waveform emphasis processing circuit shown in FIG. 1 in which the frequency-gain characteristic shown in FIG. 8 is realized.

In this case also, if the low frequency range is cut off by a low frequency cut-off filter, the phase in the low frequency range is lead and, if the high frequency range is cut off by a high frequency cut-off filter, the phase in the high frequency range is lagged.

Therefore, when a frequency-gain characteristic as shown in FIG. 8 is to be realized, the constants of the low frequency cut-off filter and high frequency cut-off filter are determined such that the range in which phase distortion is generated lies outside L3 and H3, in order that phase distortion is generated only to a small extent in the effective audio frequency range.

The audio signal waveform emphasis processing device may be realized by:

(1) an analogue device constituted by analog passive elements and active elements;
(2) a digital device that digitally calculates a digital signal;
(3) a digital signal processor (DSP) that performs software calculation;
(4) a device constituted by package software and soundboard control software.

Figure 10:
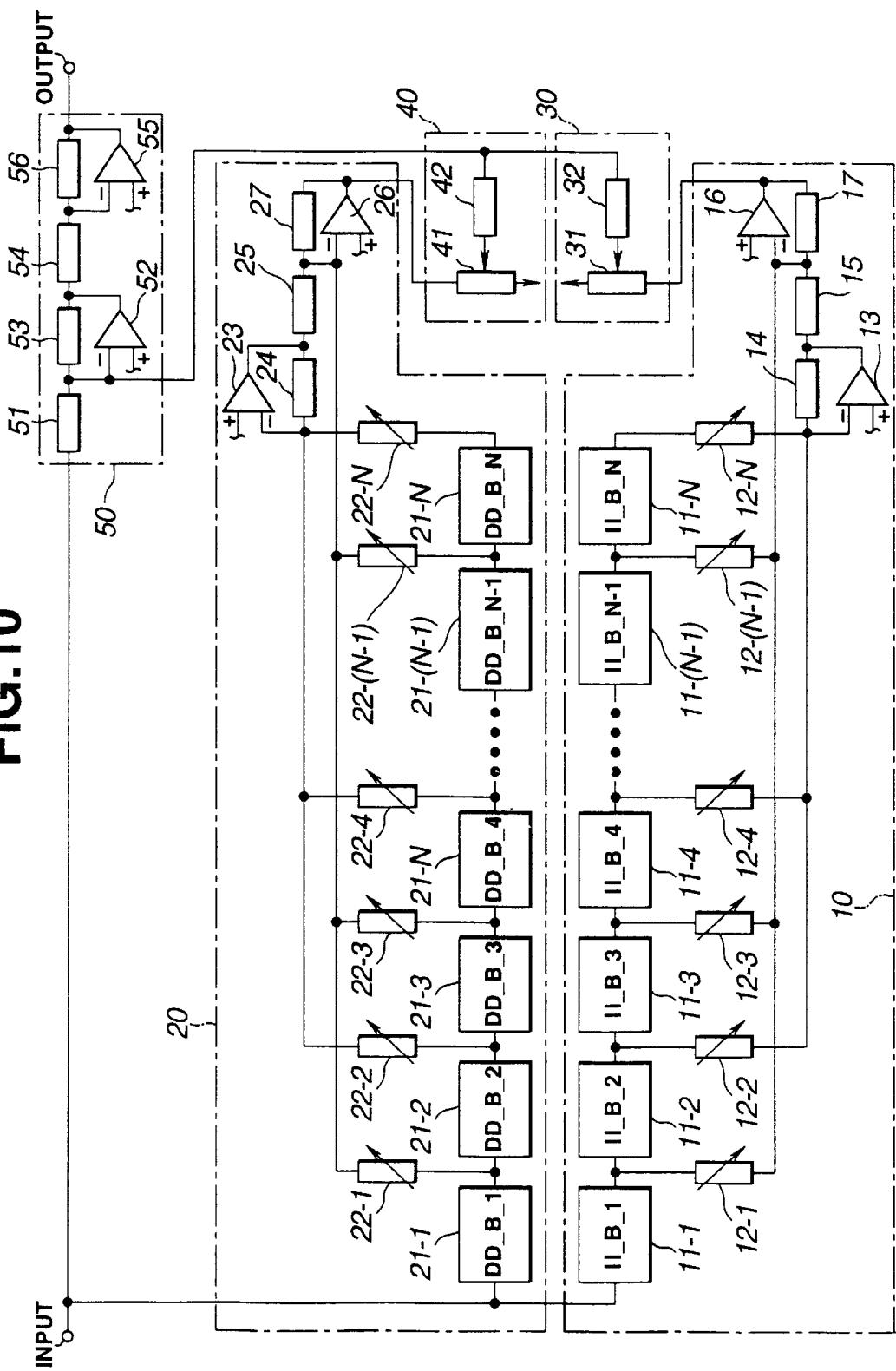
FIG. 10 is a circuit diagram illustrating a specific construction of an audio signal waveform emphasis processing device to which the audio signal waveform emphasis processing device and method according to the present invention have been applied.

FIG. 10 is a circuit diagram showing a specific circuit configuration wherein an audio signal waveform emphasis processing device according to the present invention is realized by an analogue circuit constituted by passive elements and active elements.

In FIG. 10, low frequency range emphasis circuit 10 corresponds to low frequency range emphasis processing section 100 shown in FIG. 1; high frequency range emphasis circuit 20 corresponds to high frequency range emphasis processing section 200 shown in FIG. 1; low frequency range adjustment circuit 30 corresponds to coefficient generator 300 shown in FIG. 1; high frequency range adjustment circuit 40 corresponds to coefficient generator 400 shown in FIG. 1; and addition circuit 50 corresponds to adder 500 shown in FIG. 1.

Low frequency range emphasis circuit 10 comprises N double integrating circuits 11-1, 11-2, . . . , 11-N; N coefficient generators 12-1, 12-2, . . . , 12-N respectively connected to the outputs of the N double integrating circuits 11-1, 11-2, . . . , 11-N; a first inverting amplification circuit constituted of an operational amplifier 13 and resistor 14, for adding the outputs of coefficient generators 12-2, 12-4, . . . , 12-N; and a second inverting amplification circuit constituted of a resistor 15 and operational amplifier 16 and a resistor 17, for adding the output of the first inverting amplification circuit and the outputs of coefficient generators 12-1, 12-3, . . . , 12-(N-1).

The N double integrating circuits 11-1, 11-2, . . . , 11-N correspond to the double integrators II1, II2, . . . , II$p$ shown in FIG. 1; the N coefficient generators 12-1, 12-2, . . . , 12-N correspond to the coefficient generators b1, b2, . . . , b$p$ shown in FIG. 1; and the first: inverting amplification circuit and second inverting amplification circuit correspond to adder SUMI shown in FIG. 1.

Figure 11:
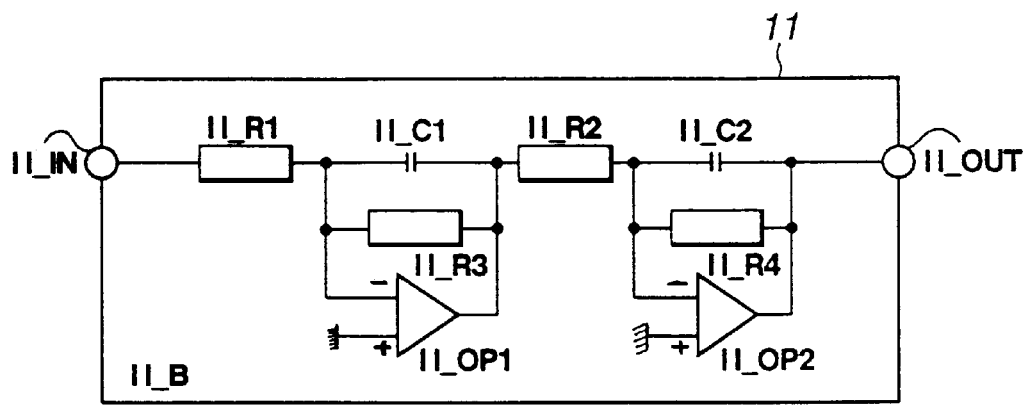
FIG. 11 is a circuit diagram showing a specific example of the double integrating circuit of FIG. 10.

The N double integrating circuits 11-1, 11-2, . . . , 11-N may respectively be constituted by the circuit shown in FIG. 11.

In FIG. 11, the double integration circuit (II_B) 11 comprises a first integrating circuit consisting of resistor II_R1, capacitor II_C1, resistor II_R3, and operational amplifier II_OP1 and a second integrating circuit consisting of resistor II_R2, capacitor II_C2, resistor II_R4, and operational amplifier II_OP2. A signal that is input from input terminal II_in is double-integrated and is output from output terminal II_out.

High frequency range emphasis circuit 20 comprises a first inverting amplification circuit constituted of N double differentiating circuits 21-1, 21-2, . . . , 21-N; N coefficient generators 21-1, 22-2, . . . , 22-N respectively connected to the outputs of the N double differentiating circuits 21-1, 21-2, . . . , 21-N; a first inverting amplification circuit constituted by operational amplifier 23 and resistor 24, for adding the outputs of coefficient generators 22-2, 22-4, . . . , 22-N; and a second inverting amplification circuit constituted by resistor 25 and operational amplifier 26 and resistor 27, for adding the output of the first inverting amplification circuit and the outputs of coefficient generators 22-1, 22-3, . . . , 22-(N-1).

The N double differentiating circuits 21-1, 21-2, . . . , 21-N of high frequency range emphasis circuit 20 correspond to the double differentiators DD1, DD2, . . . , DD$q$ shown in FIG. 1; the N coefficient generators 22-1, 22-2, . . . , 22-N correspond to coefficient generators c1, c2, . . . , c$q$ shown in FIG. 1, and the first inverting amplification circuit and second inverting amplification circuit correspond to adder SUMD shown in FIG. 1.

Figure 12:
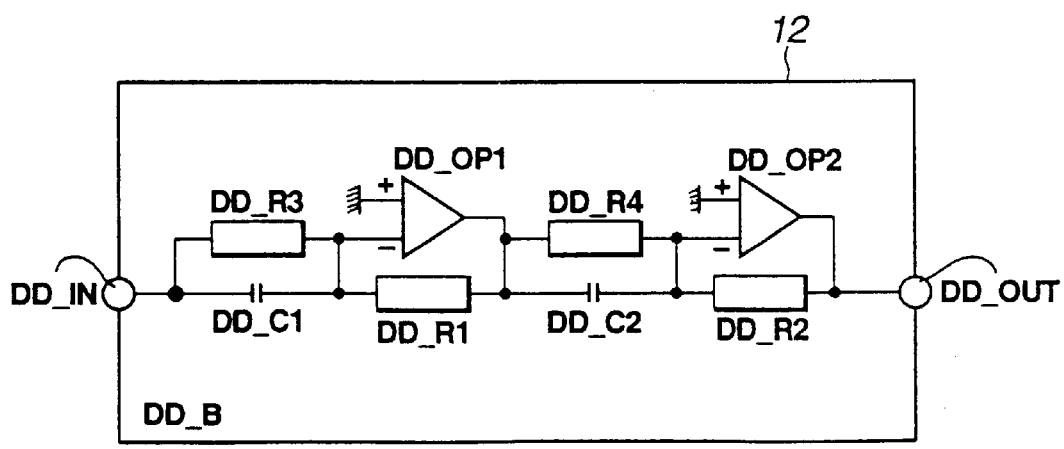
FIG. 12 is a circuit diagram showing a specific example of the double differential circuit of FIG. 10.

The N double integrating circuits 21-1, 21-2, . . . , 21-N may be respectively constituted by the circuit shown in FIG. 12.

In FIG. 12, the double differentiating circuit (DD_B)12 comprises a first differentiating circuit consisting of resistor DD_R3, capacitor DD_C1, resistor DD_R1, and operational amplifier DD_OP1; and a second differentiating circuit consisting of resistor DD_R4, capacitor DD_C2, resistor DD_R2, and operational amplifier DD_OP2. Asignal that is input from input terminal DD_in is double-differentiated and is output from output terminal DD_out.

The basic operation of low frequency range emphasis circuit 10 and high frequency range emphasis circuit 20 shown in FIG. 10 is the same as the processing of low frequency range emphasis processing section 100 and high frequency range emphasis processing section 200 shown in FIG. 1.

Low frequency range adjustment circuit 30 comprises a variable resistor 31 and fixed resistor 32 and performs adjustment of the output level of low frequency range emphasis circuit 10; the output of the low frequency range adjustment circuit 30 is input to addition circuit 50.

High frequency range adjustment circuit 40 is constituted of variable resistor 41 and fixed resistor 42 and performs adjustment of the output level of high frequency range emphasis circuit 20; the output of the high frequency range adjustment circuit 40 is input to addition circuit 50.

Addition circuit 50 comprises a first inverting amplifier consisting of resistor 51, operational amplifier 52, and resistor 53 and that adds the original signal applied to input terminal INPUT and the output of low frequency range adjustment circuit 30 and the output of high frequency range adjustment circuit 40; and a second inverting amplifier consisting of resistor 54, operational amplifier 55, and resistor 56 which inverts the output of the first inverting amplifier and outputs this to output terminal OUTPUT.

The basic operation of low frequency range adjustment circuit 30 and high frequency range adjustment circuit 40 and addition circuit 50 shown in FIG. 10 is the same as the processing of coefficient generator 300 and coefficient generator 400 and addition circuit 500 shown in FIG. 1.

With the configuration of FIG. 10, just as in the audio signal waveform emphasis processing device shown in FIG. 1, an output signal having the desired frequency-gain characteristic in which the high frequency range and low frequency range are emphasized can be obtained from the output terminal OUTPUT, without destroying the mutual phase relationship between the frequency components constituting the audio signal that is input from input terminal INPUT.

Figure 13:
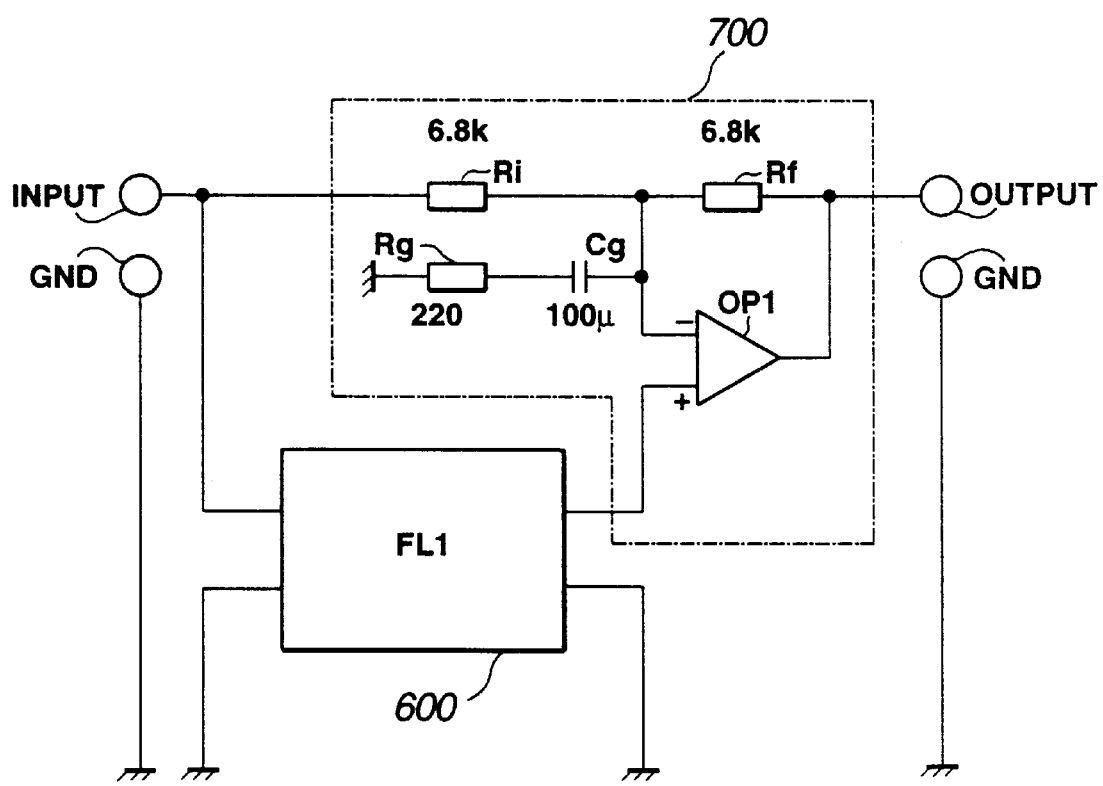
FIG. 13 is a circuit diagram illustrating yet another embodiment of an audio signal waveform emphasis processing device according to the present invention.

FIG. 13 is a circuit diagram showing yet a further embodiment of an audio signal waveform emphasis processing device according to the present invention, wherein the configuration shown in FIG. 10 is simplified.

In FIG. 13, this circuit is constituted of a waveform emphasis circuit (FL1) 600 that performs waveform emphasis in respect of the high frequency range and low frequency range on an original signal applied between input terminal INPUT and ground terminal GND, and an addition circuit 700 that adds the original signal applied between input terminal INPUT and ground terminal GND and the waveform-emphasized signal that has been subjected to waveform emphasis by waveform emphasis circuit 600.

Figure 14:
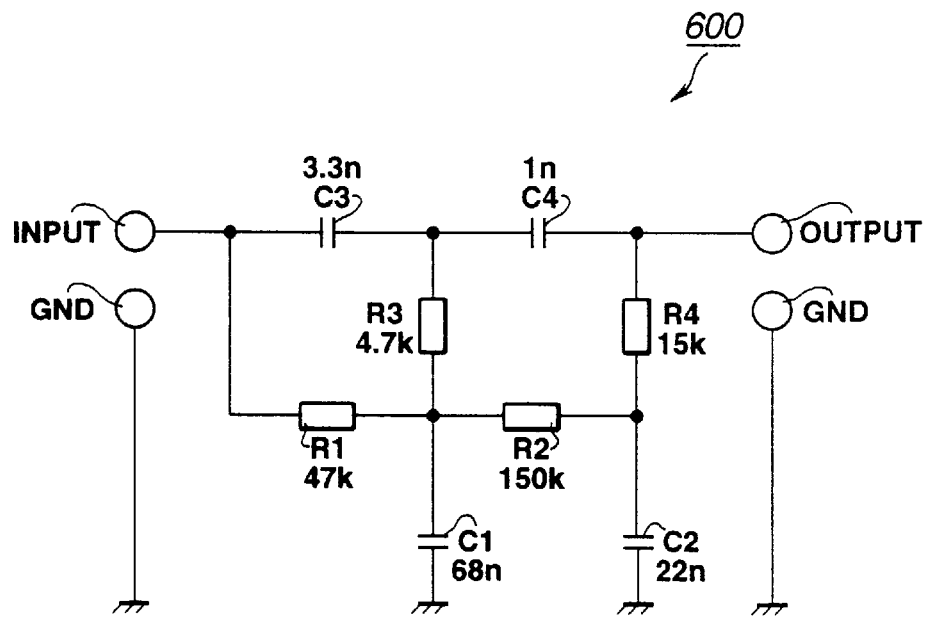
FIG. 14 is a circuit diagram illustrating a specific example of the waveform emphasis circuit shown in FIG. 13.

FIG. 14 shows a specific example of the waveform emphasis circuit 600.

The waveform emphasis circuit 600 shown in FIG. 14 is constituted by combining a double differentiating circuit (high pass filter) of maximum gain about 30 times consisting of resistors R3, R4, and capacitors C3, C4 with a double integrating circuit (low pass filter) of maximum gain about 30 times consisting of resistors R1, R2 and capacitors C1, C2.

In the waveform emphasis circuit 600 shown in FIG. 14, the absolute value of the impedance in the low frequency range of capacitors C3, C4 constituting the double differentiating circuit is a value that is negligible in comparison with the absolute value of the impedance of resistors R1, R2 and capacitors C1, C2 constituting the double integrating circuit.

Consequently, the effect of the double differentiating circuit consisting of resistors R3, R4 and capacitors C3, C4 on the frequency-gain characteristic in the low frequency range of the double integrating circuit consisting of resistors R1, R2 and capacitors C1, C2 is negligible.

Also, the absolute value of the impedance in the high frequency range of capacitors C1, C2 constituting the double differentiating circuit is a value that is negligible in comparison with the absolute value of the impedance of resistors R3, R4, and capacitors C3, C4 constituting the double differentiating circuit.

The effect of the double integrating circuit consisting of resistors R1, R2 and capacitors C1, C2 on the frequency-gain characteristic in the high frequency range of the double differentiating circuit consisting of resistors R3, R4 and capacitors C3, C4 can therefore be neglected.

The waveform emphasis circuit 600 shown in FIG. 4 therefore acts as a circuit that performs waveform emphasis for the high frequency range and low frequency range.

Figure 15:
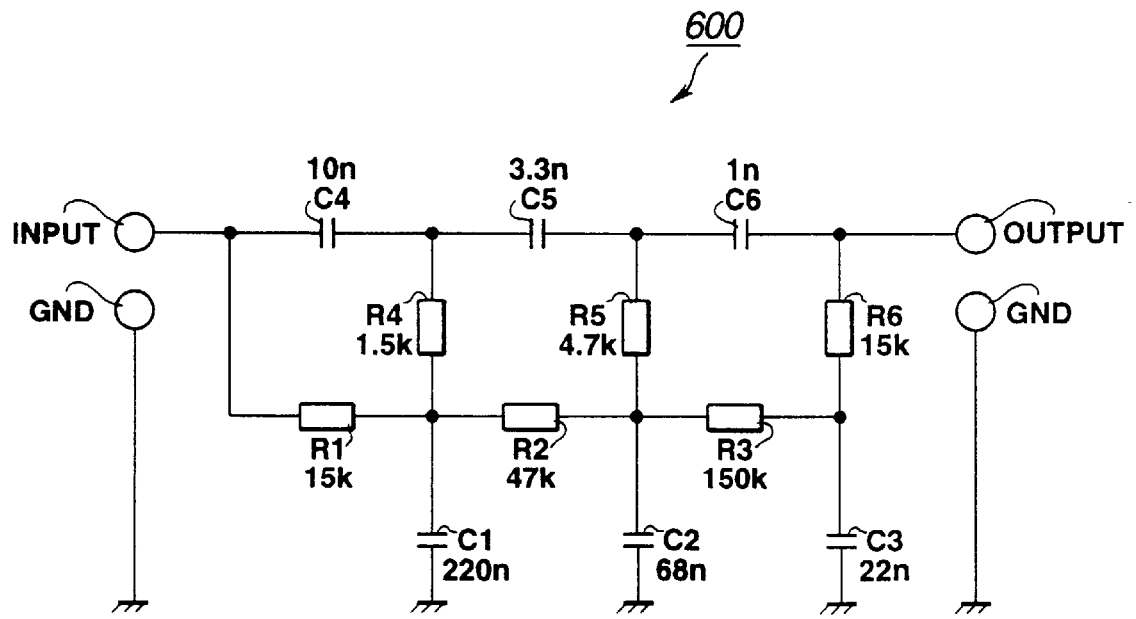
FIG. 15 is a circuit diagram showing another specific example of the waveform emphasis circuit shown in FIG. 13.

The waveform emphasis circuit 600 shown in FIG. 13 could be constructed of the circuit shown in FIG. 15 instead of the circuit shown in FIG. 14.

The circuit shown in FIG. 15 is constituted by coupling a high pass filter consisting of resistors R4, R5, R6 and capacitors C4, C5, C6 with a low pass filter consisting of resistors R1, R2, R3, and capacitors C1, C2, C3.

Waveform emphasis in the high frequency range and low frequency range can be obtained with the circuit shown in FIG. 15 just as in the case of the circuit shown in FIG. 14.

The circuit shown in FIG. 15 is in principle third-order in respect of both the low frequency range and the high frequency range, but, due to the mutual interaction of the respective constants of differentiation and integration in the practical circuit, a characteristic close to second-order is obtained, so a circuit is obtained which is effective in practice.

In FIG. 13, addition circuit 700 is constituted of resistors Ri, Rf, Rg, capacitor Cg and operational amplifier OP1.

Since Ri is set to be equal to Rf (Ri=Rf), operational amplifier OP1 functions as an inverting amplifier of gain 1. In other words, the output of the operational amplifier OP1 is of the same magnitude as the input but inverted in phase. Resistance Rg has scarcely any effect on the input/output gain of this circuit.

Also, the degree of emphasis in the low frequency range and high frequency range in the addition circuit 700 is determined by the relationship of resistor Rg and resistor Rf, since the effect of resistor Ri is negligible because Rg<<Ri.

Capacitor Cg is a capacitor that is necessary in an actual operating circuit: it has the function of reducing the DC offset of operational amplifier OP1 and the function of removing unnecessary signal components of the low frequency range.

Figure 16:
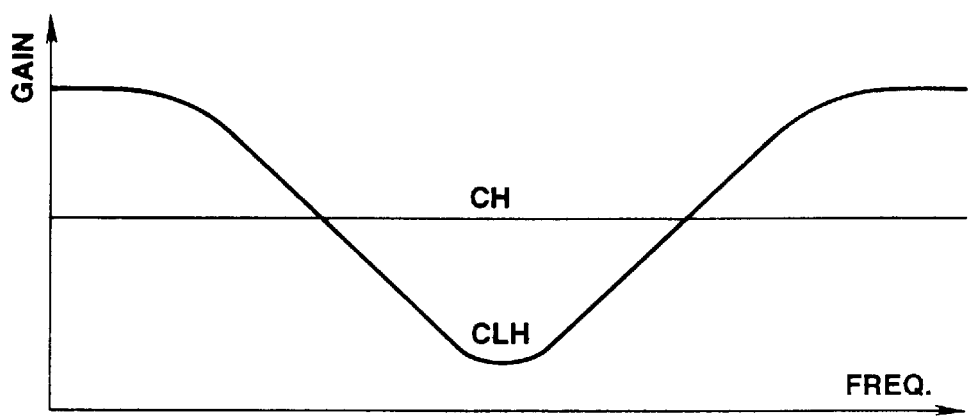
FIG. 16 is a view showing the frequency-gain characteristic of the waveform emphasis circuit in the circuit shown in FIG. 13 and the frequency-gain characteristic with respect to the original signal of an addition circuit.

FIG. 16 shows the frequency-gain characteristic CLH of waveform emphasis circuit 600 in the circuit shown in FIG. 13 and the frequency-gain characteristic CM with respect to the original signal of addition circuit 700.

As is clear from the frequency-gain characteristic CLM shown in FIG. 16, the low frequency range and high frequency range of the original signal are emphasized by waveform emphasis circuit 600, and, as is clear from the frequency-gain characteristic CM, the frequency-gain characteristic of the original signal in addition circuit 700 becomes flat.

Figure 17:
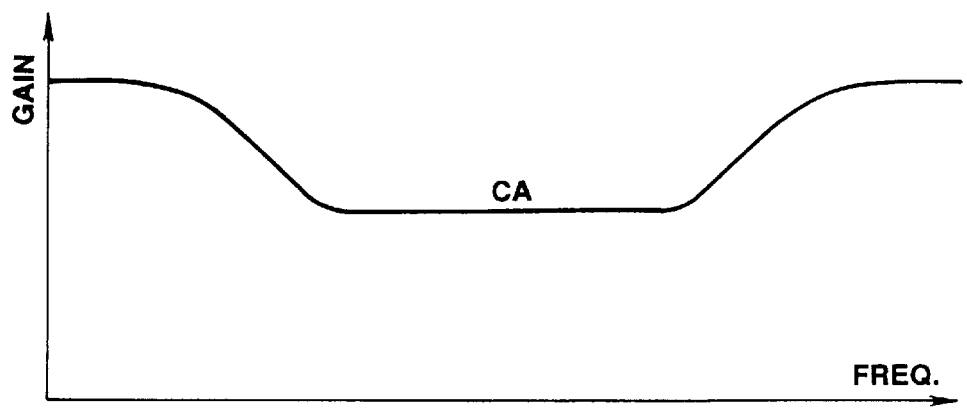
FIG. 17 is a view showing the frequency-gain characteristic of the circuit shown in FIG. 13.

With the circuit shown in FIG. 13, a waveform-emphasized signal whose low frequency range and high frequency range have been emphasized by waveform emphasis circuit 600 together with the original signal that is input from input terminal INPUT are output from output terminal Output, so the overall frequency-gain characteristic of the circuit shown in FIG. 13 is a frequency characteristic obtained by adding the frequency-gain characteristic CLH shown in FIG. 16 and the frequency-gain characteristic CM, in other words, the frequency-gain characteristic CA shown in FIG. 17.

Figure 18:
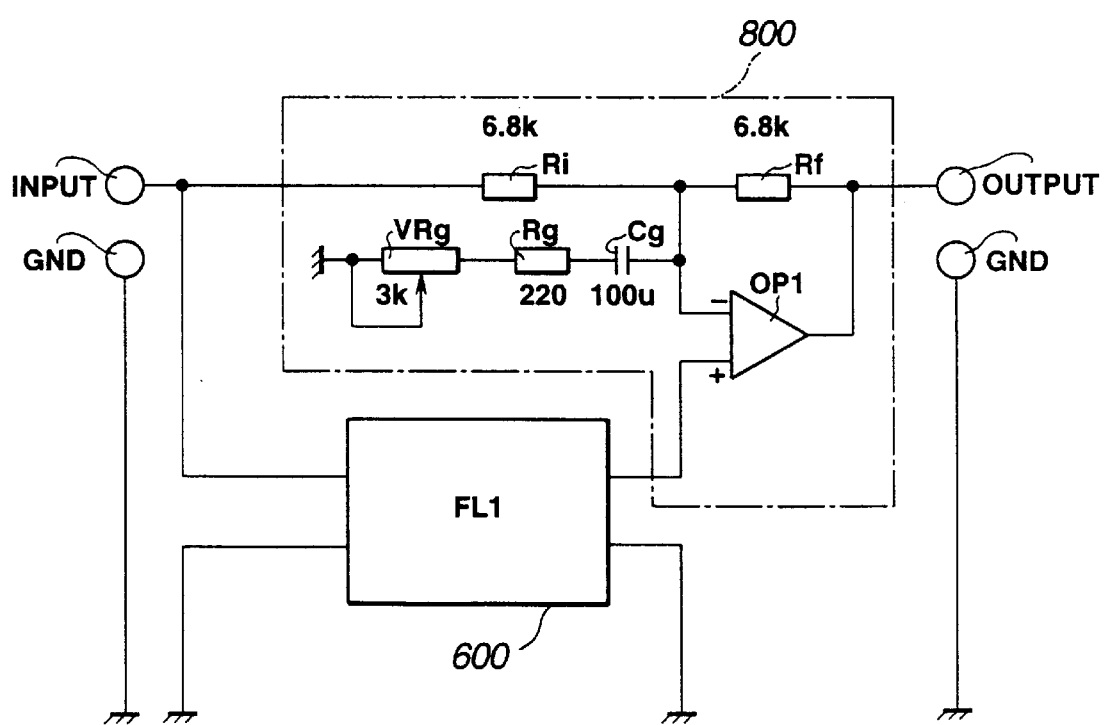
FIG. 18 is a circuit diagram of yet another embodiment of an audio signal waveform emphasis processing device according to the present invention wherein the degree of emphasis of the low frequency range and the high frequency range can be adjusted by a single variable resistor, by adding the variable resistor to the circuit shown in FIG. 13.

FIG. 18 is a circuit diagram showing yet another embodiment of an audio signal waveform emphasis processing device according to the present invention wherein the degree of emphasis of the low frequency range and high frequency range can be adjusted by addition of a variable resistor VRg to the circuit shown in FIG. 13.

In FIG. 18, variable resistor VRg is connected between resistor Rg and the ground. The rest of the configuration in FIG. 16 is the same as the circuit shown in FIG. 13.

Specifically, in the circuit shown in FIG. 18, addition circuit 800 is constituted of resistances Ri, Rf, Rg, Rvg, capacitor Cg and operational amplifier OP1.

In the configuration shown in FIG. 18, when variable resistor VRg is adjusted, the relationship of resistance (VRg+Rg) and resistance Rf is altered and the degree of emphasis of the low frequency range and high frequency range with respect to the original signal can thereby be adjusted.

Figure 19:
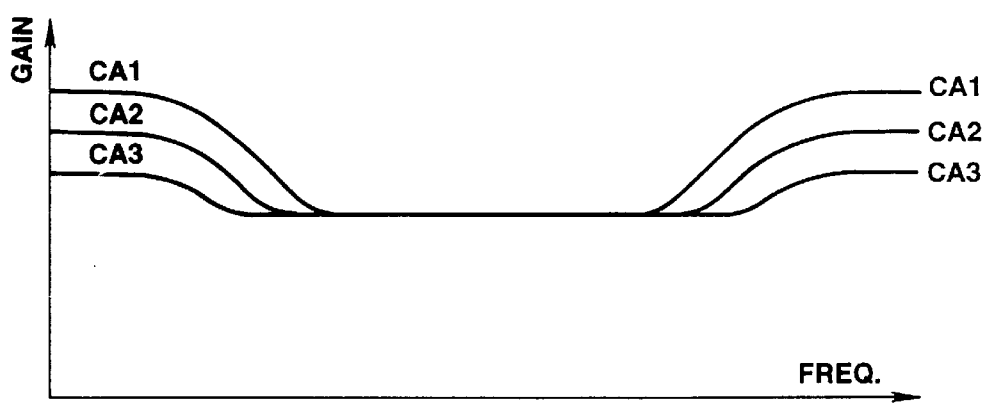
FIG. 19 is a view showing the frequency-gain characteristic when the degree of emphasis of the low frequency range and high frequency range of the circuit shown in FIG. 18 is varied.

FIG. 19 shows the frequency-gain characteristic realized with the circuit shown in FIG. 18.

As shown in FIG. 19, in the circuit shown in FIG. 18, when variable resistance VRg is adjusted, its frequency-gain characteristic can be altered as shown by CA1, CA2, or CA3.

It should be noted that, in the above configuration, integration, differentiation, multiplication, addition and coefficient are not strictly mathematical but include allowable error in the realization of a practical device. Addition generally includes subtraction. Coefficient means an arbitrary value with any signs. They could also include expression by calculation using a stored program system in addition to functions based on physical phenomena.

Calculation processing of the signal is to be performed in the frequency range of the audio signal or in a frequency range somewhat wider than this.

The double integration and double differentiation do not need to be pure integration and differentiation so long as they are sufficient to enable a practical audio device to be realized.

By "phase" in the description of the present invention is meant the phase dependent on the complex impedance of the lumped parameter circuit. "Phase" in the phase delay of an element having a delay time and "phase" in the phase dependent on the complex impedance of a linear circuit should be distinguished from "phase" in the description of the present invention.

"Phase distortion" means the phenomenon that the mutual phase relationship between the frequency components of an output of a function that inputs a signal comprising a plurality of frequency components in a specific phase relationship of the input is different from the phase relationship of the input.

In the present invention "low frequency range" means for example the frequency range below 300 Hz.

"High frequency range" means for example the frequency range above 1,000 Hz.

"Middle frequency range" means for example the frequency range from 300 Hz to 1,000 Hz.

"Unnecessary low frequency range" means the low frequency range which is clearly unnecessary in auditory perception, for example a frequency range of below 20 Hz; the "unnecessary high frequency range" means the high frequency range that is clearly unnecessary for auditory perception, for example a frequency range of more than 20 kHz.

What is claimed is:

1. An audio signal waveform emphasis processing device comprising:

integration means comprising one or a plurality of even-order integrators for performing integration of even-numbered order on an input audio signal;

differentiation means comprising one or a plurality of even-order differentiators for performing differentiation of even-numbered order on the input audio signal; and addition means for adding output of the integration means and output of the differentiation means to the input audio signal in the same phase or in reverse-phase with the input audio signal.

2. The audio signal waveform emphasis processing device according to claim 1, wherein:

the integration means comprises a plurality of double integrators for performing successive double integration on the input audio signal;

the differentiation means comprises a plurality of double differentiators for performing successive double differentiation on the input audio signal; and the addition means comprises:

a plurality of first coefficient means for respectively multiplying outputs of a plurality of the double integrators by a first coefficient;

a first adder for adding outputs of a plurality of the first coefficient means;

a plurality of second coefficient means for respectively multiplying outputs of a plurality of the double differentiators by a second coefficient;

a second adder for adding outputs of a plurality of the second coefficient means;

third coefficient means for multiplying output of the first adder by a third coefficient;

fourth coefficient means for multiplying output of the second adder by a fourth coefficient; and a third adder for adding output of the third coefficient means and output of the fourth coefficient means to the input audio signal.

3. The audio signal waveform emphasis processing device according to claim 2, wherein a first group of coefficients including the first coefficient with which multiplication is effected by the first coefficient means and a second group of coefficients including the second coefficient with which multiplication is effected by the second coefficient means are determined in correspondence with a desired frequency-gain characteristic.

4. The audio signal waveform emphasis processing device according to claim 2, wherein the third coefficient with which multiplication is effected by the third coefficient means is determined in accordance with the degree of emphasis in a low frequency range of the input audio signal, and the fourth coefficient with which multiplication is effected by the fourth coefficient means is determined in accordance with the degree of emphasis in the high frequency ranges of the input audio signal.

5. The audio signal waveform emphasis processing device according to claim 1, wherein the integration means comprises a single double integrator; the differentiation means comprises a single double differentiator, and the addition means comprises an adder for inverting output of the single double integrator and output of the single double differentiator, obtaining signals by multiplying the inverted outputs by arbitrary coefficients respectively and adding the signals to the input audio signal.

6. An audio signal waveform emphasis processing device comprising:

a plurality of cascade-connected double integrating circuits for performing successive double integration on an input audio signal;

a plurality of cascade-connected double differentiating circuits that perform successive double differentiation on the input audio signal;

a plurality of first coefficient generators for multiplying a first coefficient respectively with outputs of even-numbered double integrating circuits of the plurality of double integrating circuits;

a first addition circuit for inverting and adding outputs of the plurality of the first coefficient generators;

a plurality of second coefficient generators for respectively multiplying a second coefficient with outputs of odd-numbered double integration circuits of the plurality of the double integration circuits;

a second addition circuit for inverting and adding outputs of the plurality of the second coefficient generators and output of the first addition circuit;

a third coefficient generator for multiplying a third coefficient with the output of the first addition circuit;

a fourth coefficient generator for multiplying a fourth coefficient with output of the second addition circuit; and a third addition circuit for adding output of the third coefficient generator and output of the fourth coefficient generator to the input audio signal.

7. An audio signal waveform emphasis processing method comprising:

a first step of performing even-order integration on an input audio signal;

a second step of performing even-order differentiation on the input audio signal; and a third step of adding the even-order integrated input audio signal produced in the first step and the even-order differentiated input audio signal produced in the second step to the input audio signal.

8. The method of audio signal waveform emphasis processing according to claim 7, wherein:

the first step comprises a step of performing double integration on the input audio signal successively a plurality of times;

the second step comprises a step of performing double differentiation on the input audio signal successively a plurality of times; and the third step comprises:

a fourth step of multiplying a first coefficient respectively with values obtained by double integration each of the plurality of times in the first step;

a fifth step of adding the double-integrated values that are multiplied by the first coefficient in the fourth step;

a sixth step of multiplying a second coefficient respectively with values obtained by double differentiation each of the plurality of times in the second step;

a seventh step of adding the double-differentiated values that are multiplied by the second coefficient in the sixth step; and an eighth step of multiplying a third coefficient and a fourth coefficient respectively with the sum that is obtained by the addition in the fifth step and the sum that is obtained by the addition in the seventh step, and adding results to the input audio signal.

9. The method of audio signal waveform emphasis processing according to claim 8, wherein a first coefficient group containing the first coefficient and second coefficient group containing the second coefficient are determined in accordance with a desired frequency-gain characteristic.

10. The method of audio signal waveform emphasis processing according to claim 8, wherein the third coefficient and fourth coefficient are determined in accordance with the degree of emphasis in a low frequency range and a high frequency range of the input audio signal.

* * * * *